(12) United States Patent
Evans

(10) Patent No.: US 6,966,017 B2
(45) Date of Patent: Nov. 15, 2005

(54) CACHE MEMORY SELF TEST

(75) Inventor: Richard J. Evans, Bristol (GB)

(73) Assignee: Broadcom Corporation, Irvine, CA (US)

( * ) Notice: Subject to any disclaimer, the term of this patent is extended or adjusted under 35 U.S.C. 154(b) by 468 days.

(21) Appl. No.: 10/173,048

(22) Filed: Jun. 18, 2002

(65) Prior Publication Data

US 2003/0051197 A1 Mar. 13, 2003

Related U.S. Application Data

(60) Provisional application No. 60/299,176, filed on Jun. 20, 2001.

(51) Int. Cl.[7] .............................................. G11C 29/00
(52) U.S. Cl. ....................... 714/718; 714/733; 714/734; 711/144
(58) Field of Search ................................ 714/724, 733, 714/734, 738, 718, 719; 711/128

(56) References Cited

U.S. PATENT DOCUMENTS

| | | | | |
|---|---|---|---|---|
| 5,301,296 A | * | 4/1994 | Mohri et al. ................. | 711/128 |
| 5,617,531 A | | 4/1997 | Crouch et al. | |
| 5,638,382 A | * | 6/1997 | Krick et al. ................. | 714/733 |
| 5,640,509 A | | 6/1997 | Balmer et al. | |
| 5,663,965 A | | 9/1997 | Seymour | |
| 5,740,412 A | | 4/1998 | Chan et al. | |
| 5,781,721 A | | 7/1998 | Hayes et al. | |
| 5,987,635 A | | 11/1999 | Kishi et al. | |
| 6,001,662 A | | 12/1999 | Correale, Jr. et al. | |
| 6,101,578 A | | 8/2000 | Patwardhan et al. | |
| 6,115,789 A | * | 9/2000 | Durham et al. ............. | 711/118 |
| 6,145,055 A | * | 11/2000 | Fujimoto .................... | 711/128 |
| 6,351,789 B1 | * | 2/2002 | Green ......................... | 711/128 |
| 6,658,611 B1 | * | 12/2003 | Jun ............................. | 714/719 |
| 6,732,234 B1 | * | 5/2004 | Rowlands et al. ......... | 711/117 |

OTHER PUBLICATIONS

Dekker et al., "Fault Modeling and Test Algorithm Development for Static Random Access Memories", pp. 343–353, *IEEE Int'l Test Conference*, 1988.

Brauch et al., "Design of Cache Test Hardware on the HP PA8500", pp. 58–63, *IEEE Design & Test of Computers*, 1998.

van der Goor, J., "Using Tests to Test SRAMs", pp. 8–14, *IEEE Design & Test of Computers*, Mar. 1993.

L. Baste et al., "Testing The MC68030 Caches", Integration Of Test With Design And Manufacturing, *1987 Proceedings Of The International Test Conference*, Washington, DC, IEEE Comp. vol. Conf. 18, Sep. 1, 1987, pp. 826–833.

European Search Report, issued Nov. 19, 2002 in European Patent Applications No. 02254230.2.

* cited by examiner

*Primary Examiner*—Phung My Chung
(74) *Attorney, Agent, or Firm*—Sterne, Kessler, Goldstein & Fox PLLC

(57) ABSTRACT

The benefits of on-chip self testing are widely recognized and include the capability to test at high operating speed and independently of external test equipment timing and accuracy limitations. However caches present difficulties since for testing purposes they are conventionally regarded as separate RAM and CAM arrays. The disclosed test engine tests the cache as a whole (i.e., RAM, CAM and comparators together). In the test mode, cache writes are absolutely addressable, selecting a particular entry in a particular way-set during each operation using line addressing and common tag data. This enables read operations to access a specific cache line as if absolutely addressable based on only a partial address and the known tag setting.

23 Claims, 2 Drawing Sheets

CACHE MEMORY SELF TEST

CROSS-REFERENCE TO RELATED APPLICATION

This application claims priority to Provisional U.S. Patent Application Ser No. 60/299,176, filed Jun. 20, 2001, which is incorporated herein by reference in its entirety.

BACKGROUND OF THE INVENTION

Field of the Invention

The inventive concepts relate to built-in self-test (BIST) units, for cache memories, which allow the integrated circuits (ICs) incorporating the cache memories to perform tests of the cache memories, for example for verification testing during IC manufacture.

As the technology for making integrated circuitry, such as memory devices, has advanced, more and more circuits and functions are built into one chip. There is a need to test all of the different functions of the circuits within each chip, for example, all of the memories and all of the read and write circuits, before the integrated circuit is usable in a particular product.

Hence, integrated memory circuits typically undergo device verification testing during manufacture. A specialized integrated circuit device tester may be used to perform such tests. The use of such equipment, however, increases the costs of manufacturing the memory circuits. In addition, for integrated circuit devices that provide large memory arrays, the cycle time required to perform such read/write tests increases in proportion to the size of the array.

To overcome difficulties and reduce costs associated with external testing of integrated circuit memories, integrated circuits have been constructed with built-in self-test (BIST) circuitry. Built-in self-have test units have many advantages over using external automatic test equipment (ATE). These include the ability to run at full speed using an on-board phase-locked loop (PLL) independently of the ATE timing and accuracy limitations, as well as a large reduction in the number of test vectors to be stored off-line. Memories are ideal candidates for BIST, since they are very regular structures, making the algorithms required to test them relatively easy to realize in hardware.

Cache memories, however, are harder to test since there is an associated tag memory, such as a content address memory (CAM), corresponding to each location in RAM, for storing the necessary tag for each entry which defines where new data is written and old data is read from. The conventional approach to built-in self-testing of a cache would be to logically divide the cache into two parts, the RAM array and the CAM array, and then perform separate tests on each part. The RAM would be tested using a normal RAM BIST engine; whereas the CAM probably would be tested by ad-hoc functional tests. Theoretically, the CAM array could be scan tested in such a separate test, if all CAM elements were scannable. Pattern generation would be completely automated, and relatively few scan patterns would be required. However, in some cache memory devices the CAM cells are not scannable.

One approach considered for self-testing of such non-scannable CAM cells might involve a separate 'macrotest' of the CAM cells, using the scan chains surrounding the cache to setup and observe results. For such a macrotest, assume that scan data can be shifted in, so that the CAM cells can be programmed in a single cycle following the scan chain shift. Only one CAM word can be written at a time. The CAM cells retain their state while the scan chains are shifting. Also, it would be assumed that observability of a hit on match lines is provided in a scannable flip-flop (FF). To observe the results of the CAM scan test then would require observation of the wordlines driven by the match logic output in scan FFs. In the best case, where it is possible to observe all match logic outputs separately, a basic stuck-at type test on the CAM array requires $2(N+(1+M))$ cycles, where N is the number of CAM words and M is the CAM word width.

However, to perform such a test, it would be necessary to program the whole cache to known values $O(N)$, match all lines simultaneously $O(1)$, and then mismatch all lines simultaneously by a single bit $O(M)$. The process must be repeated for true and complement data. For a CAM with a 4 bit field (including valid bit) and 1280 entries, the number of parallel patterns required is 2570. Assuming that this is a scan based test and that the scan chains are 400 FFs long, the total number of cycles needed is $400*2570=1,028,000$ cycles. This is not acceptable for a macrotest length mainly because it consumes too much pin memory. More limited access to the match lines would drive the pattern count higher still, making a macrotest approach impractical.

As shown by the discussion above, there is a continuing need for a technique to efficiently implement built-in self-testing of a cache memory. To provide the necessary efficiency, there is an attendant need for testing the entire cache in a single operation, instead of requiring separate tests for the RAM and the CAM. There is a further need for a self-testing technique that requires a minimum amount of time. To be cost effective, any self-test device implemented on an IC must comprise a minimum amount of circuitry and/or require minimal real-estate on the chip.

SUMMARY OF THE INVENTION

The inventive concepts satisfy the above stated needs relating to cache self-testing and alleviate the above noted problems by providing a built-in self-test engine which is able to test a cache as a whole (i.e., RAM, CAM and comparators together) rather than using a divide and conquer technique.

With the inventive built-in self-test unit, the operations for writing to the cache are substantially absolute, selecting a particular entry in a particular way-set during each operation. During write operations, tag bits are set appropriately for each of the cache lines in any given way-set, so that read operations using only a partial address and the known tag setting can access data from a specific line as though it were addressed absolutely.

For example, one aspect of the present invention relates to a built-in self-test unit for testing a cache memory block on an integrated circuit. The preferred embodiment of such a built-in self-test unit includes a controller with an associated address generator, for supplying predetermined address information to the cache memory block. A data generator supplies predetermined test data to the cache memory block, in response to signals from the controller.

Other aspects of the invention relate to a test algorithm implemented by a state-machine or the like forming the controller of the built-in self-test unit. In general, the write operations of the test algorithm involve writing the test pattern data to storage in lines of random access memory, in the way-sets within the cache memory block and writing tag bits to tag storage for each line, as though each line were addressed absolutely. This enables the attendant read operations to read stored data from each line of the cache based on a series of partial addresses and known tag settings from the address generator.

In the preferred embodiment, the cache memory block outputs data from storage in specific lines of the way-sets to a result register, in a predetermined sequence. The result register forms a test signature from the data output from the cache memory block. The test signature provides an indication of overall operability of at least the random access memory and the tag storage of the cache memory block, and preferably indicates the operability of the entire circuitry of the cache memory block.

Hence, self-test units in accord with the invention control the information stored in the tag fields, e.g. within the CAM cells, to facilitate a fast easy access during the subsequent read-out portion of the test operation. As test data is written into the cache, the unit writes to any cache line in a deterministic manner. Essentially, the write operations manipulate the tag bits as well as the data written to the RAM lines of the memory. The preferred embodiment of the test operation entails absolute addressing of each line of the cache by providing a way-set address and a tag that matches all of the entries in that way-set. Preferably, the addressing during write operations sets all of the tag cells in each of the way-sets to the same one of several tag data values. For certain parts of the test, each different way-set receives a different one of the values for its tag data. For other parts of the BIST tests, all tag cells in all way-sets receive the same tag data. Hence, during the read operation, a partial address with one tag will provide an absolute address with one tag for a line within that way-set.

No design for test (DFT) logic is embedded inside the cache memory itself. The BIST engine comprises several circuit parts that 'wrap' the cache circuitry on the chip and can be distributed appropriately in the floorplan during building of the IC.

The preferred embodiment of the BIST testing procedure provides a complete RAM test (equivalent to a MAT C-RAM test, although the algorithm can be changed for any other), together with a 100% stuck-at test of CAM cells and comparator logic.

The signature register is used to generate a pass/fail result from the BIST. In the disclosed embodiments, the signature register is the same width as the cache read data (64 bits) but, unusually, works so that the final signature is compressed in such a way that reading out a subset of the signature (for example, the top 20 bits in the preferred implementation) is sufficient to guarantee determination of a good or bad result of the cache test.

The preferred embodiment utilizes a multiple input signature register (MISR) type result register. The MISR is essentially a shift register, or preferably a number of serially connected shift registers, with a number of exclusive OR (XOR) gates connected in a feedback loop. The XOR gates connect to particular taps of the register or sub-registers to supply certain values from the data in the MISR back to the input. The MISR shifts and feeds back data every cycle, essentially to build up a signature of the test, similar to a cyclic redundancy check. The correct signature is a known function of the test inputs (data, addresses and tags), and a match of the MISR output or even a portion thereof to the expected signature, can indicate that the cache is in fact operative as expected. A failure to match the expected signature or portion thereof indicates a fault.

Additional objects, advantages and novel features of the invention will be set forth in part in the description which follows, and in part will become apparent to those skilled in the art upon examination of the following and the accompanying drawings or may be learned by practice of the invention. The objects and advantages of the invention may be realized and attained by means of the instrumentalities and combinations particularly pointed out in the appended claims.

BRIEF DESCRIPTION OF THE DRAWINGS

The drawing figures depict preferred embodiments of the present invention by way of example, not by way of limitations. In the figures, like reference numerals refer to the same or similar elements.

FIG. 4 is a simplified diagram useful in explaining a preferred implementation of a multiple input signature register (MISR) used in the built-in self-test unit shown in FIG. 1.

DETAILED DESCRIPTION OF THE PREFERRED EMBODIMENTS

The various aspects of the invention disclosed herein relate to a built-in self-test unit and/or associated test procedures for testing a cache memory, which provide a unified test of the entire cache system. Reference now is made in detail to the presently preferred embodiments of the invention, examples of which are illustrated in the accompanying drawings and discussed below.

Figure 1:
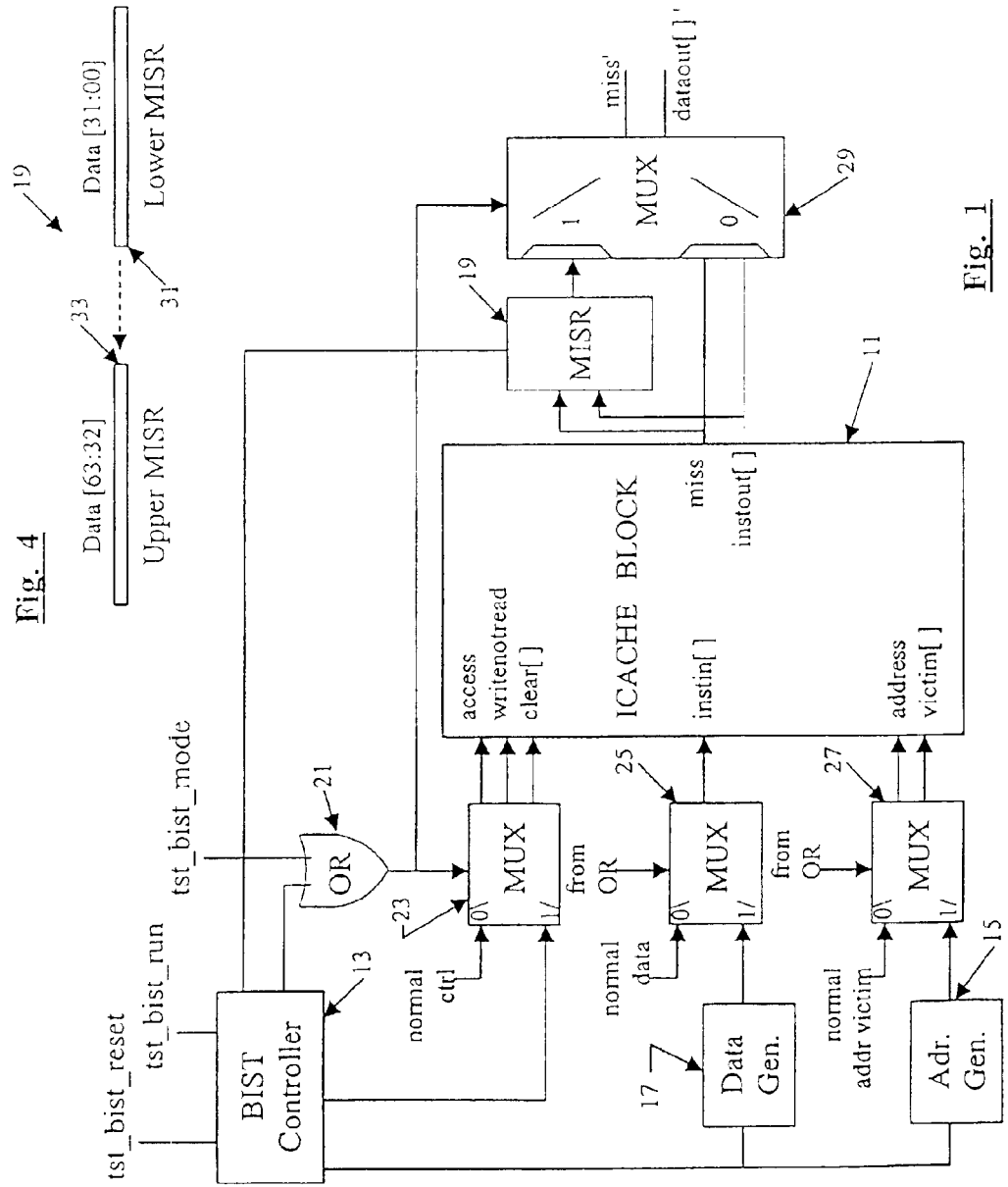
FIG. 1 is a functional block diagram of a of a portion of a processor chip incorporating an instruction cache memory as well as an exemplary built-in self-test circuit, for testing the instruction cache memory in accord with the invention.

FIG. 1 illustrates a portion of an integrated circuit (IC), for example a portion of a programmable processor. The illustrated portion of the IC includes a cache memory block 11. The invention is applicable to self-testing of any type of cache memory.

In the illustrated example, the cache memory 11 under test is an instruction cache memory block. The other elements shown in FIG. 1 are elements of a built-in self-test unit, for performing the inventive self-testing of the instruction cache memory block 11.

Figures 2, 3:
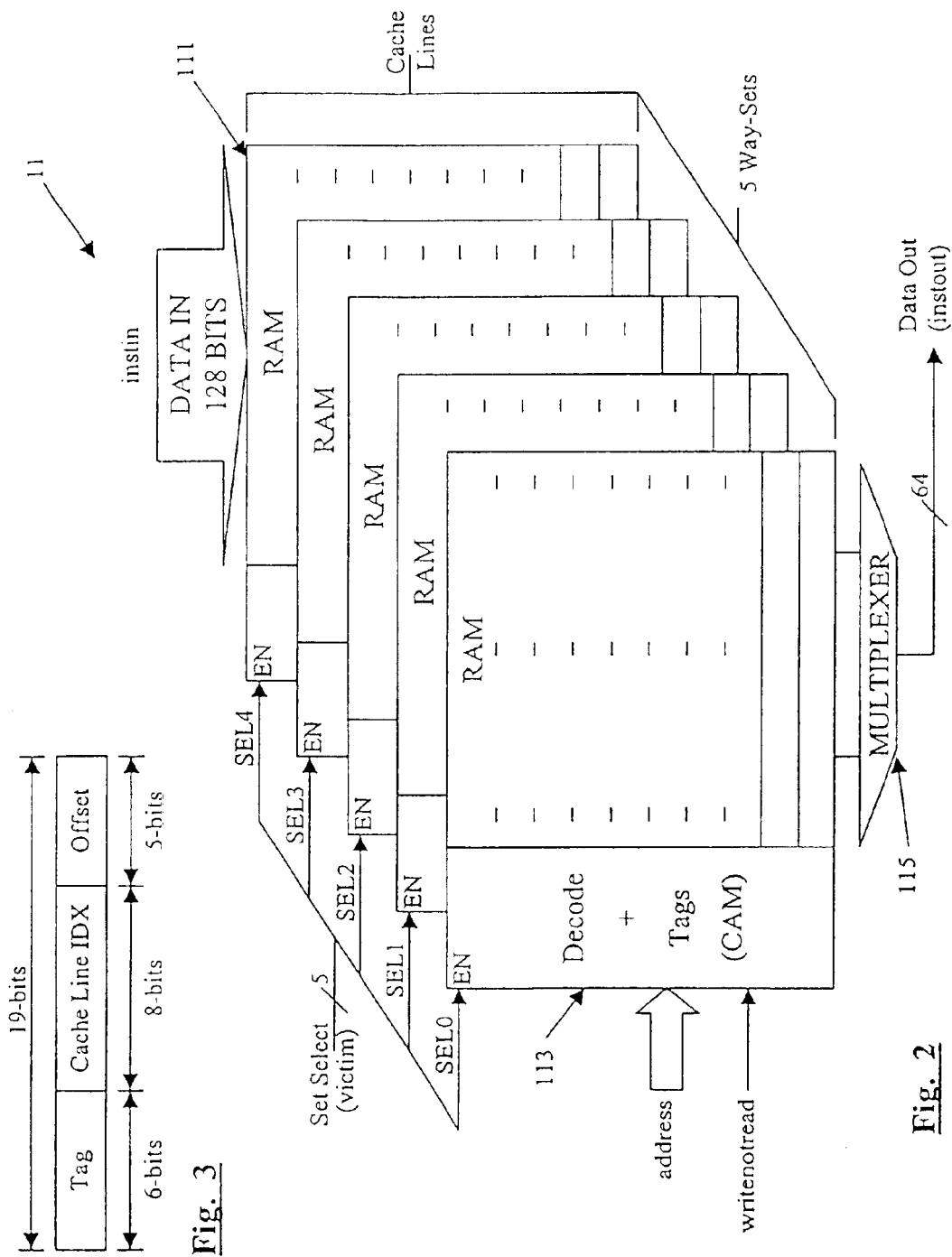
FIG. 2 is a simplified functional block diagram of the instruction cache memory, which is tested by the built-in self-test circuit of FIG. 1
FIG. 3 shows the format of an address vector applied to the instruction cache memory of FIG. 2.

To appreciate the testing technique and associated hardware, it may be helpful first to take a moment to review the nature of the circuit under test, in this example, the instruction cache memory block 11. FIG. 2 is a simplified functional block diagram of the instruction cache memory block 11.

The instruction cache memory 11 is a fast access static RAM that preferably sits close to the core of the processor IC. This cache runs at the core frequency and provides instructions to the instruction decoder of the processor, with a 1-cycle access time. In one embodiment to be tested in accord with the invention, the instruction cache has a size of 40 Kbytes and uses a 5 way-set associative random replacement design. Each cache line in the block comprises 256 bits (i.e. 4×64 bit instructions).

As shown, is simplified form in FIG. 2, the instruction cache block 11 comprises five way-sets each having RAM 111 as well as a section 113 of decode logic and tag storage. As discussed more later, the tag storage in section 113 uses a content addressable memory (CAM) cell design. The instruction cache block 11 also includes a multiplexer 115, for supplying data from the cache RAM to an appropriate output.

The instruction cache 11 provides a store of instructions close to the core. The cache also stores a tag to identify each of the stored instructions, for example, based on a portion of the normal instruction address. When an instruction is required, the core accesses the instruction cache 11 to see if that instruction is present. If so the instruction is forwarded to the instruction decoder (not shown). If not present, the instruction is fetched from the main instruction RAM (not shown), a higher latency process, before being forwarded to the decoder and in parallel being stored to the instruction cache 11 for future use.

A Tag storage in section 113 of the instruction cache 11 relies on the use of CAM cells (content addressable memory cells) to select the cache-line in a particular way-set if there is a hit. The CAM cells sit alongside the main word-line decoder within the cache memory block 11. Use of such cells for the tag storage allows the tag comparison to be executed in parallel with the word-line decode. Essentially, a portion of the address of the desired item of data, or in this case the desired instruction line (program count), is compared to the tags stored in the CAM cells. The result of the comparison is used as an input to the word-line decoder in section 113 within the cache memory block 11, so that the word-line is driven only if the tag matches.

When a new instruction is required, the chip program counter (PC) is applied to the instruction cache 11 in the form of an address. In the present embodiment of the cache 11, the program counter (PC) is supplied as a nineteen bit byte address vector to the cache 11, as shown for example in FIG. 3. This translates to a 16-bit instruction address (64 instruction=8 bytes). This address is split into three fields: the cache-line offset, the cache-line index and the tag. The 5-bits forming the cache-line offset point to one instruction in the cache-line. Since the instructions are 8 bytes wide and always aligned to a long boundary, the least significant 3 bits of the 19-bit byte address are all zero. The cache-line offset is therefore 2 bits wide, choosing 1 of 4 instructions on a cache-line. The cache-line index points to one particular cache-line in the ways of the cache 11 and is therefore 8-bits wide. Since the instruction RAM is 512 kbytes (2k cache-lines), the tag address remaining is 6-bits wide.

In the drawing, the set select line is a bus of 'enable' signals which selects which way-set to activate (as a "victim") for a write operation. During such an operation, the bus applies an appropriate one of five enable signals to an enable input of the decode and tag logic 113 of the respective one of the five way-sets. During the write operation, the address input provides address data to the logic section 113. The tag part of the address data is written to the CAM cell associated with the selected cache line within the active way-set. Hence, when an entry is created in an empty location, one of the 5 way-sets is chosen randomly, and the cache-line index points to a position in the way-set in which to store the bits of the instruction. The tag address is stored alongside the cache-line, that is to say in the associated CAM cell.

The set select input is not used during a read operation. The address input selects the same cache line in all way sets, based on 8-bits of partial address data in the cache line index in the address vector (FIG. 3), and the contents of the associated CAM cells are tested for a match to the tag field of the read-address vector. Hence, when read accesses are made to the cache 11, the cache-line index of the applied address is decoded, and the tag is read. If the stored tag matches the applied tag, the required instruction is stored in that entry, and the access is said to have hit. The cache outputs the instruction that corresponds to the stored tag, which produced the hit, from the appropriate cache line.

Because the embodiment has a 5 way set associative cache, each of the way-sets must be accessed in this manner in parallel resulting in 1 out of the 5 matching (a hit), or none (a miss). Multiple hits will never occur, because once an entry has been created, that entry will hit preventing further entries being created with the same tag. An extra bit, the valid bit, is included in the tag to indicate if that entry is valid. This prevents accidental hits from occurring on start-up, for example.

If the tag matches the CAM data for the respective line, then the output of data from the way-set with the matching CAM is enabled. The offset bits from the address determine which 64-bit chunk of the cache line is output from the cache block 11 via the multiplexer 115.

The preceding few paragraphs together with FIGS. 2 and 3 provide a summary or overview of the instruction 11 cache tested in the exemplary implementation of the built-in self-test procedure of the present invention. Returning to FIG. 1, the built-in self-test unit or engine for testing the instruction cache memory block 11 may be made of three major parts and appropriate couplings to the cache block 11. The first of the major parts is a BIST controller or sequencer 13, which preferably includes integrated address generation, although the drawing shows a separate address generator 15, for convenience of illustration and discussion. The built-in self-test unit also includes a data generator 17 and a result register. As discussed more below, the preferred embodiment of the result register is a multiple input signature register (MISR) 19. Alternatively, other types of "result" outputs could be used and compared to determine overall operability. The BIST controller 113 with the built-in address generator 15, and the data generator 17, are located adjacent to the input-side of the cache block 11. The MISR result register 19 is located adjacent to the output-side of the cache block 11.

For purposes of interconnecting with the instruction cache blocks 11 and interconnecting that block with other elements on the chip, the BIST engine also includes an OR gate 21, which controls a number of selectors or multiplexers. Specifically, in the illustrated example, the OR gate 21 controls three input multiplexers 23, 25 and 27. The OR gate 21 also controls an output multiplexer 29. Although several of the leads to or from the multiplexers appear as single lines in the drawing, for convenience, several of the multiplexers actually selectively pass several related types of signals through to parallel inputs of the cache 11, as discussed below.

The BIST controller 13 receives two inputs, a reset input tst_bist_reset, and a run instruction input tst_bist_run, which causes the BIST controller 13 to initiate the self-test procedure for the associated instruction cache block 11. The tst_bist_run signal is essentially a signal to the controller 13 to initiate its sequence of operations to run through the BIST test routine. The tst_bist_reset signal causes the controller to reset its operations state.

Typically, the controller receives these signals and the OR gate 21 receives the tst_bist_mode signal, from a JTAG controller on the IC chip. The JTAG controller is the hi-level logic on the chip for controlling all test modes on the chip. The JTAG controller is implemented in accord with an appropriate IEEE standard. Those skilled in the art will realize, however, that the illustrated circuitry will provide the inventive self-test for the cache in response to the reset and run signals, regardless of the source thereof.

The OR gate 21 will apply a control signal to switch the selector/multiplexers 23, 25, 27 and 29 from their normal settings to their test settings in response either to a signal from the BIST controller 13 or a tst_test_mode signal input from the JTAG controller. In its normal setting, the multiplexer 23 supplies normal control information from the other elements on the chip, received on its 0 inputs, to the access inputs and to the writenotread input of the instruction cache block 11. The access input receives instructions to execute a write or read operation, essentially it is simply an 'enable' line for the cache as a whole.

The signal on the writenotread input determines the particular type of operation, that is to say, whether an operation is a write operation or a read operation. For example, a 1 may be applied to this input of the instruction cache 11 to cause the cache to perform a write (not read), whereas a 0 on this input indicates a read operation. The clear input is a signal that will set the 'invalid' bits in all cache lines to be high.

When activated by the OR gate 21, the multiplexer 23 supplies control information from the BIST controller 13, received on lines associated with its 1 inputs, to the access and writenotread inputs of the instruction cache block 11. In this mode, the multiplexer enables the controller to supply the cache control information during a BIST test procedure. The multiplexer 23 also selectively provides the appropriate signal to the clear input of the cache 11, either from the other elements on the chip or from the BIST controller 13, depending on the state of the signal from the OR gate 21.

The instin input of the cache memory block receives instruction data for storage in the way-sets of the cache memory. The selector/multiplexer 25 controls the data flow into the instin input of the instruction cache block 11. In its normal setting, the multiplexer 25 supplies instruction data from the other elements on the chip, received on its 0 input, to the instin input of the instruction cache block 11. Normally, these instructions come from the processor on the chip. When activated by the OR gate 21 for a test procedure, however, the multiplexer 25 supplies test data from the generator 17, received on its 1 input, to the instin input of the instruction cache block 11 for storage in the way-sets of the cache memory.

Similarly, the selector/multiplexer 27 controls the flow of address information to the victim input and the address input of the instruction cache block 11. The bits applied to the victim input of the cache 11 select the way-sets (victims) in the cache memory, which will be over-written with new data during a write operation. The information applied to the address input select the line within the cache, either for a write operation or for a read operation. In its normal setting, the multiplexer 27 supplies address and/or victim data from the other elements on the chip (not shown), received on its 0 inputs, to the address and victim inputs of the instruction cache block 11 to facilitate normal read and write operations of the cache. When activated by the OR gate 21, the multiplexer 27 supplies test addresses and test way-set selection data from the generator 15, received on its 1 inputs, to the address and victim inputs of the instruction cache block 11.

On the output side, the selector/multiplexer 29 selectively outputs either the miss and instruction information during normal instruction cache operations, or it outputs test result information from the MISR type result register 19. Again, the state of the multiplexer 29 is controlled by the OR gate 21, that is to say so that the multiplexer 29 outputs the test result during the test procedure only.

The OR gate 21 and the selectors 23, 25, 27 and 29 allow full control of the illustrated inputs and selection of an output, during a test mode. The OR 21 gate activates the selectors to the test setting either when it receives a tst_bist_mode signal from the higher level test controller on the chip or when it receives a signal from the BIST controller 13. Through these elements, the BIST controller 13 takes control of the 'writenotread' and 'access' ports of the cache during both BIST and scan operations. In the latter case it blocks writes to the RAM when the scan chains are shifting. The BIST controller 13 supplies the signal to the OR gate 13, as part of the BIST test itself. The tst_bist_mode signal allows the JTAG controller to activate the selectors, to similarly isolate the cache for other test operations.

For example, The IC will preferably include means (not shown) for running a scan-test of elements on the chip. The selective control of the inputs of the cache block 11 also allows the BIST controller 13 to isolate the cache during the scan test, to thereby write-protect the cache and preserve the data stored in the cache.

Although not shown for purposes of the discussion here, the cache 11 includes a number of other inputs and outputs for normal operations. Some of those inputs and outputs, such as a clock input will receive input information from the other element(s) on the chip during the test.

The components of the BIST engine are distributed into convenient areas of the chip for the cache layout, e.g., with the data generator 17 and possibly the address generator 15 remote from the controller 13, for example. The BIST engine for testing the instruction cache 11 runs at 500 MHz to provide a full speed test of the cache memory.

The BIST controller 13 comprises a synthesized logic block, outside the actual cache memory unit 11. This controller 13 contains the state machines and counters necessary to control the other units of the BIST engine and thereby implement the test algorithm as discussed more, below.

Since the controller 13 requires a counter to keep track of address operations, it makes sense to use this counter to provide the addresses to the memory 11 during the actual BIST test procedure. All sequences of addresses can be covered using either an incrementer/decrementer or a reversible linear feedback shift register (LFSR). The absolute order of addresses is not important so long as order during the 'up' pass is exactly the opposite of the order during the 'down' pass. Using a De Bruijn sequence generator (an LFSR which can pass through both all-0 and all-1 states) can make for a faster, more compact circuit, but it is easier to debug a normal incrementer/decrementer arrangement.

The data generator 17 creates the different background patterns, in response to demand from the BIST controller 13. The preferred embodiments select one of 8 data patterns and choose whether or not to invert them, so a 4 bit interface between data generator 17 and the BIST controller 13 is required for such an exemplary implementation.

There are two generally used approaches to computing results for BIST logic. One involves a comparator checking output data against expected data on every cycle and providing two fail flags, one of which monitors each cycle for a mismatch, and one of which stays set once the first mismatch is found. With the other approach, a signature register computes some kind of compression of the output data, and the signature can be matched at the end against a 'golden' value.

Rather than build a cycle-by-cycle comparator, it is also possible to combine the two, by computing a signature throughout the test, and then comparing this with the 'final' signature only at the end to get a one bit pass/fail result. The preferred embodiment utilizes a multiple input signature register (MISR). The MISR 19 receives and processes the 'miss' output as well as the instruction data output ('instout') from the cache memory block 11. The MISR 19 calculates a test signature based on the shifting of these two outputs from the cache and the attendant feedback of values from the shifted data, as the BIST controller cycles through the test procedure.

The state of the multiplexer 29 determines whether the actual outputs are taken from the miss and instout lines of the cache 11 or from the corresponding outputs of the MISR 19. In the normal mode, the multiplexer supplies the miss and instruction output data directly from the cache memory block 11. In a test mode, activated through the OR gate 21, the multiplexer supplies the outputs from the MISR 19. The outputs of the MISR 19 may be supplied to comparator logic (not separately shown), for comparison of all or part of the signature to an expected value. This comparator logic may be at a separate location, but preferably is within the BIST controller 13.

The MISR 19 is essentially a shift register with a number of exclusive OR (XOR) gates connected in a feedback loop. The XOR gates connect to particular taps of the register to supply certain values from the data in the register back to the input. The MISR shifts and feeds back data every cycle, essentially to build up a signature of the test, similar to a cyclic redundancy check. The correct signature is a known function of the test inputs (data, addresses and tags), and a match of the MISR output to the expected signature indicates that the cache is in fact operative as expected. A failure to match the expected signature indicates a fault.

When running the test on a board mounted IC (RUNBIST), the unit extracts only the pass/fail flag, but in the production test there is an option of extracting the complete signature at any point in the test via the scan chains.

Since the RAM output width is 64 bits, it would be possible to choose a 64 bit MISR register 19 as the signature register. However, the preferred embodiment also observes the 'hit' flag and sometimes needs to observe the hit flag without compressing data into the signature (i.e., during a miss the data output is immaterial). So, the test unit shown in FIG. 1 effectively has a 64 bit MISR 19, with the hit signal fed into the LSBs feedback input of the MISR, which can be controlled to perform the following:

reset compress hit signal compress hit and dataout signals stall

At the end of the test, the unit extracts the MISR value from the cache IC block 11. If the MISR 19 is made of scannable FFs, then this involves entering scan test mode and shifting it out. The MISR 19 locks at the end of the BIST procedure and retains its value as the higher-level Test Mode Controller (not shown) on the chip cycles.

Alternatively, it is possible to capture the contents of the MISR 19 into a TAP register and shift it out directly. The number of bits to be captured in this way can be reduced by building the MISR from two 32 bit parts as shown for example in FIG. 4. Although two 32 bit sections 31 and 33 are shown, the 64 bit MISR 19 actually may be constructed of three or more still smaller register portions.

The split does not have to be equal—the size of the shortest MISR becomes the limiting factor on the accuracy of the test. If it is assumed that the aliassing probability is approximately ½**N, with N being the width of the shortest MISR section 31 or 33, then N=16 would be an acceptable lower limit.

Splitting the MISR 19 in this way has circuit design advantages as well, in that the feedback bit from the MSB of one MISR section 31 or 33 to the LSB input of that section has less wire distance to travel. So, from this point of view, splitting the MISR into four 16-bit parts would be one beneficial choice.

However, LFSR/MISR structures have a curious property that a primitive polynomial of 8n bits, for any n, will have at least 5 terms. For other lengths of LFSR it is possible to generate primitive polynomials with only 3 terms. In terms of circuit design this means then the test unit design can effectively save two XOR gates in the feedback path by choosing not to use registers in multiples of 8 bits.

The preferred embodiment of the 64-bit MISR 19 uses three register sections, specifically two 22-bit registers and one 20-bit register, for which the polynomials are:

$X^{22}+X^1+1$ $X^{20}+X^3+1$

So long as all error bits captured in the lower MISR(s) are transferred to the upper MISR 33, it is sufficient to copy and extract only the value from the upper one. In fact, for the single pass/fail bit it is sufficient to compare the result in the upper MISR 33 with its expected signatures. This is achieved by continuing to 'compress' zero data into the MISR sections after the actual end of the RAM test.

Since the RAM can not be written through during scan testing, there could be a large amount of logic on its output that is not sufficiently testable. The inventive embodiment avoids this situation by multiplexing the normal cache data output with the MISR outputs, so that during scan tests the MISR can be loaded with scan data and used to drive any logic hanging off the cache output.

BIST Algorithm

As shown by the discussion of the hardware above, there is a single BIST engine with a single signature register, which control the whole cache, execute an algorithm from start to finish (whose function is hidden from the user) and compute an overall signature at the end. For ease of use the BIST engine also produces a 'done' flag and a 'pass' flag by comparing the signature against the expected value within the BIST controller 13 itself. The BIST engine executes a single finite state test algorithm, for overall testing of the entire cache block 11.

For ease of explanation, however, it may be helpful to consider the presently preferred BIST algorithm as implementing a series of test stages for testing of the overall instruction cache block 11. These stages include a RAM test, which effectively tests the RAM and exercises certain functions of the CAM cells. The preferred BIST algorithm preferably includes a comparator test stage and a Valid Bit Test stage.

The embodiment of the BIST engine requires no logic to be inserted into the cache to provide separate control of RAM, CAM and comparators in a conventional manner. Stated another way, the CAM and comparators are used normally during test of the RAM and vice-versa. In fact the test of the CAM and part of the comparator test stage completely overlap the segment of the algorithm stage to test the RAM. The second and third stages address only half the faults in the comparators (is the mismatch operation) and the correct operation of the invalid bits in each cache-line.

The unified single test algorithm, including the three conceptual test stages preferably provides a single pass-fail or go-no go result, indicating whether or not the entire cache memory block 11 was operative.

In the presently preferred embodiment for testing the instruction cache block described above, the self test will require approximately 325K cycles, and will be executed at full speed taking approximately 0.65 ms of run time at 500 MHz. By programming the PLL appropriately, the test can be run at slower speed (to investigate functional vs. speed failures) and possibly faster speeds allowing the RAM to be characterized beyond the rated speed of the associated CPU core.

No DFT logic is required in the cache block 11 itself to implement this test. The BIST engine comprises the self-test hardware multiplexed at the front end of the cache to supply all stimuli and the MISR 19 multiplexed at the back end to computes the signature. It is recommended that the BIST hardware and MISR are switched in, both during BIST and scan test mode, so that the logic needed to write protect during scan can be included in the BIST hardware.

The self-test of the instruction cache should test for any likely defects that can cause faulty operation at speed: address decoding (incl. set selection etc) defects, RAM array defects, CAM cell defects, CAM match logic defects, and valid bit defects. It is not an objective of the cache test to supply detailed bit-map/failure diagnosis information.

The BIST engine provides address, data and control signals to the instruction cache 11, both during BIST mode and scan test mode. In the latter mode, DFT logic in the BIST engine prevents the memory from losing its state while the scan chains are shifting. This forces the instruction cache 11 to obey a general DFT rule without adding DFT logic into the cache itself.

1. RAM Array Test Stage

To test the address decoding and RAM array defects we can employ a standard RAM test algorithm. The preferred embodiment uses the MAT C-algorithm, as discussed later, which is widely regarded as giving the best combination of defect coverage (including all static and transient coupling faults) and efficient operation. The MAT C-algorithm is extended for the physical layout of the array by running it several times with suitable data backgrounds to detect all likely coupling faults within any cache line. To use the MAT C-algorithm, the self-test unit should be able to write to and read from any cache line in the RAM directly.

During WRITE operations, the self-test unit has full control of the address lines to select which cache line and offset is accessed within a set. The test unit controls the 'victim' select lines to choose which way-set is accessed. The tag field in the address is written to the selected cache line's CAM, and the data input is written to the RAM array.

During READ operations, the victim select lines are unused, and the tags stored in the cache are matched against the incoming address tag fields to determine which word lines will be enabled. If the remaining address bits select one of these enabled word lines, then data from that cache line will be read out.

So, as long as the corresponding cache line in each way-set has different tag data (set during the write operation), the test unit can effectively address any location in the entire cache absolutely throughout the test.

During read operations, the test unit relies on the tag field in the address matching in the CAM cells for valid data to be read out (a 'hit'). If the CAM cells fail to match, then the test unit detects a miss; if a RAM cell or decoder fault is present, then the unit reads out bad data. So, both data lines and the 'hit' signal need to be logged for each read.

Thus, if the tag data written throughout one way-set is the same, a partial address in association with a common tag can uniquely address each line in that way-set during a read operation. This is sufficient for absolute addressing of a unified cache (e.g. as if there is only one way-set). If the cache block 11 comprises multiple way-sets (FIG. 2), then each way-set should store different tag data (set during the write operation), so as to effectively enable absolute addressing in the multiple way-sets during the read operation using a combination of partial address and tag data.

Running the MAT C-test fully tests the RAM array and decoders, but the test also exercises some of the functionality of the CAM cells. By writing and reading all tag cells within each way-set with the same value, but choosing a different tag value for different way-sets, it becomes possible to cover half the stuck-at defects in each CAM cell. If we use the inverse of these values as well at a later point in the test, then we cover all stuck-at defects in the CAM cells. This also covers the comparator matching function for both zero and one, but not the mismatching function.

The MAT C-algorithm, which completely consumes the CAM match tests, is of order $O(10Nk)$, where N is the number of cache lines, and k is the number of data backgrounds.

If we generate backgrounds according to: Dekker, Beenker & Thijssen, "Fault Modeling and Test Algorithm Development for Stativ Random Access Memories," IEEE International Test Conference, 1988, pp. 343–352, then:

$$k = \log2(\text{cacheline width}) + 1$$
$$= 9 \text{ for our 256 bit wide cache lines}$$

The number of data backgrounds can be reduced by taking the physical layout of the cache 11 into consideration, allowing the test unit to target only the likely cell coupling faults and so on. Clearly this can reduce the number of cycles required for the BIST test procedure and simplify design of the data generator 17.

For a single bit memory we can write the MAT C-algorithm as a snippet of Perl:

```
MARCH 0: Initialize array
for ( $addr = 0; $addr < $TOP; $addr++) {
  write_op( $addr, '1');
}
MARCH 1
for ( $addr = 0 ; $addr < $TOP ; $addr++) {
  read_op( $addr, '1');
  write_op( $addr, '0');
}
MARCH 2
for ( $addr = 0 ; $addr < $TOP ; $addr++) {
  read_op( $addr, '0');
  write_op( $addr, '1') ;
}
MARCH 3
for ( $addr = $TOP-1 ; $addr >= 0 ; $addr--_{
  read_op( $addr, '1');
  write_op( $addr, '0') ;
}
MARCH 4
for ( $addr = $TOP-1 ; $addr >= 0; $addr--_{
  read_op( $addr, '0');
  write_op( $addr, '1') ;
}
MARCH 5
for ( $addr = 0 ; $addr < $TOP ; $addr++) {
  read_op( $addr, '1') ;
}
```

Although the cache test may be running with the PLL, the control signals to reset and start the test come from the TCK domain. These two signals should be retimed to the local clock where they arrive in the BIST controller 13, to avoid metastability issues. The DONE and RESULT (pass/fail) bits fed back to the JTAG controller can be assumed to be stable when they are read, so there are no metastability problems in the other direction.

Each cache line is split into two physical rows, but both rows share the same TAG data. During the MAT C-algorithm, the test unit to read from one row in a line, writes it with different data and then reads from the next row. During this intervening write, the tag data must not be disturbed. Only write new tag data after both rows in a line have been read.

The test for the CAM cells being able to mismatch data can not be merged with the MAT C-test, so must be appended separately.

2. Comparator Test Stage

To complete the comparator test, we ensure that each tag line will correctly mismatch all data words differing from its content by 1 bit. If more than one bit mismatches then a single defect can be masked. This test is repeated by inverting the content of both the tag line and the words presented for mismatching, so as to successfully detect mismatched 1 vs 0 and 0 vs 1 data.

During the MAT C-test, the self test unit ensures that cache lines in each set would hold different tag data from those in other sets to avoid multiple hits. However, it is possible to make the mismatching test more efficient if the unit writes exactly the same tag data to all cache lines in every site. Thus for each address presented to the cache, the self-test unit can check that all 5 way sets 'miss' simultaneously; a faulty comparator in any set will cause a hit.

So, the comparator test involves setting up the whole cache so that all tags are identical and then, for each address within a set, presenting the all tag field words just a single bit different from the tag value. The built-in self-test unit repeats this process for inverted tag values, so the order of the test is $O(2(N+NM/5))$, where N is the total number of cache lines in all way sets, and M is the width of the Tag field.

Note that it does not matter what data is contained in the RAM array at this point, and the test unit does not need to monitor the output data during this stage of the test. Only the 'miss' flag is significant.

3. Valid Bit Test Stage

Finally, it is desirable to test the valid bits in each cache line. The tests above always write each cache line before reading it, and the unit has already tested the valid bits for stuck-at 'invalid'. To complete the valid bit test, it is necessary at this point in our example to test for stuck at 'valid', which is easily achieved by adding one more stage to the end of the test procedure.

At this point in the test procedure, it is known that the entire array and CAM contents are defined. The test unit issues a 'clear' instruction which resets the 'valid' bit for each cache line without destroying the data and tag values previously stored. Next it proceeds to read back data from each cache line, knowing that the tag bits should match. In each case a faulty valid bit (stuck-at valid) will result in a 'hit'; a good valid bit will result in a 'miss'.

Again, it is not actually important what data is read out; only the 'miss' flag is significant.

If the valid test is run after the mismatching test above, then all tag cells in all way-sets hold the same data. So, just as with the mismatching test it is possible to test the valid bit of the corresponding line in each set in parallel.

This adds a stage of $O(N/5)$ where N is the total number of cache lines in all way sets.

4. Overall Test Complexity

Adding the different stages of the test together produces a test on the order of $O(10Nk+2(N+NM/5)+N/5)$ The cache is complicated slightly in that each 256 bit wide cache line is actually spread over two physical 128 bit wide 'rows'. The test unit can write a row in a single write cycle, but it needs two reads cycles to read it back.

So, effectively we have

N=2560 (i.e., 1280 cache lines*2 rows per line)

M=6 k=8 (worst case=log2(128)+1)

If we assume an average of 3 operations for a complete read/write of a single row (i.e., two reads, and one write), then the total number of cycles for the complete test is approximately:

=1.5*(10Nk+2(N+NM/5)+N/5)

=324864 cycles

This is a slight underestimate since the more expensive read operations occur more often than writes. The above estimate of the required number of cycles does not include the number of cycles required to program up the phase-locked loop (PLL), start the test proper and extract the result. However, those additional requirements but will add only a few hundred cycles and can be ignored.

Since this is a BIST, there is no significant tester memory overhead no matter what the length of the test. The BIST state machine itself will not be significantly more complex than a conventional SRAM test engine.

Applying this test at 500 MHz (using PLL)=0.65 mS test time

Applying it at 10 MHZ (using TCK)=32.5 mS test time

It may not be necessary to apply the test in production at the lower speed, but this can be useful for characterization to separate out functional from speed failures. Of course, programming the PLL suitably, it should be possible to run the test at any speed in between, and possibly even beyond 500 MHz. Over specifying the BIST clock frequency would allow the RAM to be characterized beyond the associated CPU core's operating limits.

As the BIST progresses through the three stages of the overall test, the MISR 19 processes the output to form a signature of the overall test. Essentially, the MISR compresses the results from all of the tests into the final signature. Matching this signature against the 'theoretically' computed expected result provides a plain go/no-go test as to the overall operability of the cache 11.

The fact that the algorithm is explained in three stages above does not mean that this is not a unified test. The three-stage test is simply an easy way of explaining the operation of the BIST algorithm—in fact there is only one finite state machine and one algorithm to be executed. The BIST engine requires no logic to be inserted into the cache to provide separate control of RAM, CAM and comparators in a conventional manner. Stated another way, the CAM and comparators are used normally during test of the RAM and vice-versa. In fact the test of the CAM and part of the comparator test completely overlap the segment of the algorithm to test the RAM. The second and third stages address only half the faults in the comparators (is the mismatch operation) and the correct operation of the invalid bits in each cache-line.

There is a single BIST engine and signature register, which control the whole cache, execute an algorithm from start to finish (whose function is hidden from the user) and compute an overall signature at the end. For ease of use the BIST engine also produces a 'done' flag and a 'pass' flag by comparing the signature against the expected value within the BIST controller 13 itself.

As noted above, this algorithm preferably is implemented as logic in a state machine formed on the IC. Below is a somewhat simplified pseudo-code version of the BIST algorithm, which may be helpful in explaining the overall process of the exemplary test algorithm. This pseudo-code version has been simplified to avoid confusion caused by some of the implementation details (cache lines can only be read out one half at a time for example). None of these simplifications affect the essence of the test.

```
1    ##Reset
2    nSETs = 5; ## 5 way sets
3    MEMTOP = 256; ## 256 cache line rows per set
4    nBKG = 7; ## Number of data backgrounds
5    ## Start of 10N array test and CAM/comparator 'match' test
6    for (bg = 0 ; bg < nBKG ; bg++) {
7    data = dataBackground[bg]
8    ### March 0
9    for (wayset=0; wayset < nSETs ; wayset++) {
10   for ( adr=0; adr < MEMTOP; adr++) {
11   write( wayset, tag[wayset]:adr, data );
12   }
13   }
14   ### March 1
15   for (wayset=0; wayset < nSETs ; wayset++) {
16   for ( adr=0; adr < MEMTOP; adr++) {
17   read( tag[wayset]:adr );
18   write( wayset, tag[wayset]:adr, NOT(data) );
19   }
20   }
21   ### March 2
22   for (wayset=0; wayset < nSETs ; wayset++) {
23   for ( adr=0; adr < MEMTOP; adr++) {
24   read( tag[wayset]:adr );
25   write( wayset, NOT(tag[wayset]):adr, data );
26   }
27   }
28   ### March3
29   for (wayset=nSETs-1; wayset >= 0 ; wayset--) {
30   for ( adr=MEMTOP-1; adr >= 0; adr--) {
31   read( NOT(tag[wayset]):adr );
32   write( wayset, tag[wayset]:adr, NOT(data) );
33   }
34   }
35   ### March4
36   for (wayset=nSETs-1; wayset >= 0 ; wayset--) {
37   for ( adr=MEMTOP-1; adr >= 0; adr--) {
38   read( tag[wayset]:adr );
39   write( wayset, tag[wayset]:adr, data );
40   }
41   }
42   ### March 5
43   for (wayset=0; wayset < nSETs ; wayset++) {
44   for ( adr=0; adr < MEMTOP; adr++) {
45   read( tag[wayset]:adr );
46   }
47   }
48   }
49   ## END of 10N array test + CAM/comparator 'match' test
50   ## Start of CAM/Comparator 'miss' test
51   tag = '111';
52   for (wayset=0; wayset < nSETs ; wayset++) {
53   for ( adr=0; adr < MEMTOP; adr++) {
54   write( tag:adr, data );
55   }
56   }
57   tag = '110'
58   do {
59   for ( adr = 0 ; adr < MEMTOP ; adr++) {
60   read( tag:adr);
61   }
62   tag = ROTATE_LEFT(tag);
63   } until ( tag == '110')
64
65   tag = '000';
66   for (wayset=0; wayset < nSETs ; wayset++) {
67   for ( adr=0; adr < MEMTOP; adr++) {
68   write( tag:adr, data );
69   }
70   }
71   tag = '001'
72   do {
73   for ( adr = 0 ; adr < MEMTOP ; adr++) {
74   read( tag:adr);
75   }
76   tag = ROTATE_LEFT(tag);
77   } until ( tag == '001')
78
79   ## END of mismatch test
80
81   ## start of INVALID bit test
82   for ( wayset= 0 ; wayset < nSETs ; wayset++) {
83   Mark_wayset_invalid( wayset);
84   }
85   tag = '000'
86   for ( adr = 0 ; adr < MEMTOP ; adr++) {
87   read( tag:adr);
88   }
89   ## End of INVALID bit test
```

A brief explanation follows outlining the test algorithm, which the state machine of the BIST controller implements along the lines of the pseudo-code down above.

Lines 1–4 represent the start point for the BIST setting up some constant values. In this simplified version of the algorithm, the BIST controller 13 just sets up values for the number of way-sets, the number of cache lines per way-set and the number of different data backgrounds which the BIST engine will apply to the RAM.

Lines 5–50 perform the 10N test proper, which covers all traditional RAM faults in the cache's RAM array. Our extensions also cover all stuck-at 0 and stuck-at 1 faults in the CAM cells. The comparators are partly tested by ensuring that the logic correctly computes hits for both 0 vs 0 and 1 vs 1 comparisons.

In lines 6–7, the algorithm initiates an outer loop choosing which data background will be applied to the memory. The backgrounds are all computed according to the following type of sequence:

0000 0000 0000 0000 . . . 0000

0101 0101 0101 0101 . . . 0101

0011 0011 0011 0011 . . . 0011

0000 1111 0000 1111 . . . 1111

0000 0000 1111 1111 . . . 1111

. . . and so on.

In lines 8–13, the BIST engine writes the same data into all locations of all way-sets of the cache 11. Note that tag[wayset]:adr is supposed to illustrate that we write different tag data to each way-set, and that this tag data is part of the address field (as shown in FIG. 3). It is not important what the tag data is, so long as all entries within any one way-set have the same tag data, and at this stage, that tag data is unique to that way-set.

Lines 14–20 perform the first march through the cache, from lowest address to highest, from lowest numbered wayset to highest, first reading back the data previously stored and then writing inverted data into each location. Each read operation will produce a 'hit' signal and a data output, which will be merged into the MISR signature register 19. The act of matching the tag to create the 'hit' signal means that half the stuck-at faults in the CAM cells are covered by this stage as well as half the stuck-at defects which would affect a 'match' result.

The second march through the cache, executed by lines 21–27, proceeds in the same direction as the first, now reading back the inverted data from each location (stored by the last step) and writing back the original data. This time the BIST engine also writes inverted values into the TAG bits. Again, each read will produce a 'hit' signal and a data output, which will be merged into the MISR signature register 19.

Lines 28–34 of the algorithm provide a third march through the cache 11. The third march reverses the order in which operations proceed through the array, this time beginning at the highest numbered wayset and going through the address space from top to bottom. Again, the BIST engine reads back the data stored in the last step from each location, and writes back inverted data. The 'hit' signals and the data read back are merged into the MISR signature register 19. Because the BIST engine performed the match operations on the inverted tag data in this step, this part of the test covers the remaining half of the stuck-at defects in the CAM cells as well as the remaining half of the stuck-at defects affecting a 'match' result in the comparators.

The fourth march (lines 35–41) continues in the same order as the third, reading back the inverted data and then writing the original data to each location. Again, each read will produce a 'hit' signal and a data output, which will be merged into the signature register.

In lines 42–47, the BIST engine finally performs the last march to read back the data written in the previous step, merging the hit and data output signals into the MISR signature register 19.

Lines 51–79 represent the portion of the test, which completes the stuck-at coverage on the comparators. So far, the algorithm has checked that each individual comparator bit operates correctly in computing 0=0 and 1=1. Now we need to ensure that it can also correctly compute 1≠0 and 0≠1. Accordingly, a given tag value is loaded, and then the BIST engine presents the cache 11 with a tag to match (search query) that differs in only one bit position with regard to the tag value stored in the CAM. The result should be a 'miss'. The BIST engine then repeats this operation changing the bit position, which differs until the algorithm has covered all bit positions. In this manner, the BIST engine can make use of the cache's ability to check all way-sets for a miss simultaneously.

In lines 51–56, the BIST engine first loads up known data into all lines of all way-sets, and this time, the BIST engine sets all tag bits in all way-sets to the same value. We choose all ones here (shown as '111').

In lines 57–63, the algorithm next proceeds through all cache line addresses presenting the value '110'. This should produce a miss from the comparator in all way-sets at the current cache line, simultaneously. We merge the resulting 'miss' signal into the signature and ignore the data output from the cache 11. This step is repeated for '101' and '011' tag values.

Having tested half the stuck-at values in the comparators, which might erroneously cause a 'hit,' it is still necessary to test the remaining ones. Lines 65–70 of the algorithm perform such a test by loading up the TAG bits in the cache with the opposite of the value chosen previously, i.e. all zeros in the exemplary embodiment. In lines 71–77, the BIST engine mismatches the loaded all zeros against '001' '010' and '100' to complete the test.

Finally, in lines 80–89, the BIST engine tests the 'invalid' bits of the cache. There is one 'invalid' bit per cache line, which is normally set before any data has been loaded into that line. Any cache line with an invalid bit should always 'miss' against any address and tag data present for a read operation. So, first the BIST engine sets all invalid bits in all cache lines. This operation does not disturb the data and tag bits. Next, for each address the BIST engine attempts a read operation using the tag bits, which are known to be present in the CAM cells. If operation of the 'invalid' logic, is bad the cache will compute a 'hit'; if the 'invalid' logic is working the cache will compute a 'miss'. This result is merged into the MISR signature register 19 (again we ignore the data output during this stage).

When all stages of the test are complete, the signature on the MISR 19 is analyzed, to determine overall operability, for example, by comparing a portion thereof to an expected value.

Those skilled in the art will recognize that the present invention has a broad range of applications, and the embodiments admit of a wide range of modifications, without departure from the inventive concepts. For example, the illustrated embodiment provided a self-test of an instruction cache. The invention, however, is equally applicable to self-test a data cache.

As noted above, the BIST algorithm provides a plain go/no-go test as to the operability of the cache. This preferred approach provides a fast and easily executed test, which will give a quick indication of the state of the complete cache in production. However, it would be possible to read out the MISR value during each test stage (for debug), by running the BIST engine through the algorithm only to the end of the first stage and then extracting the result. Next the BIST engine is restarted from the beginning and run to the end of the second stage and so on.

As another example of a possible modification, the logic of the state machine serving as the BIST controller could be replaced with a processor programmed to implement the BIST algorithm in the manner described above.

While the foregoing has described what are considered to be the best mode and/or other preferred embodiments of the invention, it is understood that various modifications may be made therein and that the invention may be implemented in various forms and embodiments, and that it may be applied in numerous applications, only some of which have been described herein. It is intended by the following claims to claim any and all modifications and variations that fall within the true scope of the inventive concepts.

What is claimed is:

1. A built-in self-test unit for testing a cache memory block on an integrated circuit, the built-in self-test unit comprising:
    a controller;
    an address generator associated with the controller for supplying predetermined address information to the cache memory block; and
    a data generator for supplying a predetermined pattern of test data to the cache memory block in response to signals from the controller, wherein:
        (i) the controller activates the generators to sequentially execute a series of steps in accord with a test algorithm, including write operations and read operations,
        (ii) the write operations comprise writing the test data pattern to storage in lines of random access memory within the cache memory block and writing tag bits to tag storage for each line, as though each cache location were addressed absolutely, and
        (iii) the read operations comprise supplying a series of partial addresses and known tag settings from the address generator to cause the cache memory block to output data from storage in specific locations of the cache memory block in sequence.

2. The built in self-test unit as in claim 1, wherein the random access memory within the cache memory block comprises a plurality of way-sets.

3. The built-in self-test unit as in claim 1, further comprising:
    a result register for forming a test signature from the data output from the cache memory block during the read operations, wherein after completion of the test algorithm, the signature provides an indication of overall operability of the entire cache memory block.

4. The built-in self-test unit as in claim 3, wherein the result register comprises a multiple input signature register.

5. The built-in self-test unit as in claim 4, wherein the multiple input signature register comprises a plurality of serially connected shift registers, and data within a predetermined one of the shift registers provides the indication of overall operability at the end of the test algorithm.

6. The built-in self-test unit as in claim 1, wherein the address generator is implemented in logic within the controller.

7. A method of self-testing a cache memory block of an integrated circuit, comprising:
generating a test pattern of data;
generating address data and supplying the address data and the test pattern of data to the cache memory block, to write the test pattern of data to storage in lines of random access memory within the cache memory block, and to write tag bits to tag storage for each line, as though each cache location were addressed absolutely;
generating a series of partial addresses and known tag settings to access data from storage in specific locations of the cache memory block in sequence;
processing the accessed data to form a test result; and
comparing at least a portion of the test result to an expected result to determine operability of at least the random access memory and the tag storage of the cache memory block.

8. The method as in claim 7, wherein the random access memory within the cache block is arranged in a plurality of way-sets.

9. The method as in claim 8, wherein the generating and processing steps implement a MAT-C algorithm test of the random access memory and the CAM cells, a comparator test, and a Valid-bit test.

10. The method as in claim 7, wherein the test result is held in a signature register and at least a portion of the computed signature is compared to an expected signature value to determine operability.

11. The method as in claim 7, wherein the tag storage comprises a content address memory cell associated with each of the lines.

12. The method as in claim 11, wherein the generating and processing steps implement a complete test of the random access memory and a complete stuck-at test of all of the CAM cells of the cache memory block.

13. The method as in claim 7, wherein said at least a portion of the test signature consists of a predetermined number of bits of the test signature less than a total number of bits forming the test signature.

14. An integrated circuit, at least a portion of which comprises:
a cache memory block, comprising a plurality of way-sets, each way-set comprising:
(a) a plurality of lines of random access memory (RAM) for storing digital information; and
(b) a corresponding plurality of content address memory (CAM) cells, for storing tag data relating to digital information stored in the lines; and
a built-in self-test unit, for testing the cache memory block, comprising:
(1) a controller, comprising a state machine with an associated address generator;
(2) a data generator coupled to supply test data to the cache memory block in response to an instruction from the controller; and
(3) a result register coupled to an output of the cache memory block,
wherein:
the controller controls address generation and operation of the data generator to implement a test algorithm comprising write-operations and read-operations,
during each of the write-operations the controller and address generator supply addresses containing tags so each write-operation writes a line of the test data to a specifically addressable line of one of the way-sets, and tag bits are set for each line in each respective way-set to a common predetermined tag value,
during each of the read-operations, the address generator provides a sequence of partial addresses and known tags to read all data from all lines of all of the way-sets in a predetermined sequence, and
the result register produces a signature for the test based on data output from the cache memory block during said read-operations.

15. The integrated circuit as in claim 14, wherein a sub-set of the signature, less than the full signature formed in the result register, provides an indication of operability of the entire cache memory block.

16. The integrated circuit as in claim 14, wherein the cache memory block is an instruction cache.

17. The integrated circuit as in claims 14, wherein:
the state machine of the controller controls address generation during write-operations of a first test stage such that all of the tag bits in each different respective way-set are set to a different respective one of a plurality of common predetermined tag values; and
the state machine of the controller controls address generation during write-operations of a second test stage such that all of the tag bits in all of the way-sets are set to a single common predetermined tag value.

18. An integrated circuit, at least a portion of which comprises:
a cache memory block, comprising a plurality of way-sets, each way-set comprising:
(a) a plurality of lines of random access memory (RAM) for storing digital information; and
(b) a corresponding plurality of content address memory (CAM) cells, for storing tag data relating to digital information stored in the lines; and
a built-in self-test unit, for testing the cache memory block, comprising:
(1) means for conducting a self-test algorithm, comprising at least a RAM test stage followed by at least one additional test stage, on an absolute addressing basis, to fully test all elements of the cache memory block; and
(2) a result register coupled to an output of the cache memory block for forming a signature of the self-test algorithm from signals output during all of the test stages,
wherein a portion of the signature provides an indication of overall operability of the lines of random access memory and the content address memory cells of the cache memory block.

19. The integrated circuit as in claim 18, wherein the at least one additional test stage conducted by said means comprises a comparator test stage and a Valid-bit test stage.

20. The integrated circuit as in claim 18, wherein said means comprise a controller with associated address generation means and a data generator, coupled to inputs of the cache memory block.

21. An integrated circuit, at least a portion of which comprises:
- a cache memory block, comprising a plurality of way-sets, each way-set comprising:
  - (a) a plurality of lines of random access memory (RAM) for storing digital information; and
  - (b) a corresponding plurality of content address memory (CAM) cells, for storing tag data relating to digital information stored in the lines; and
- a built-in self-test unit, for testing the cache memory block, comprising:
- means for generating test data and supplying the test data to the cache memory block during writing operation of a test algorithm;
- means for supplying addresses to the cache memory block during writing operations of the test algorithm to cause writing of the test data to all of the lines of the way-sets and writing of tag data to corresponding ones of the content address memory cells, such that tag data set in the cells for all lines in each respective one of the way-sets has a common predetermined value;
- means for generating a series of partial addresses and known tag data corresponding to one or more common predetermined values to access all data from storage in specific lines of the way-sets of the cache memory block; and
- means for processing the accessed data from the cache memory to form a test signature, wherein a portion of the test indicates overall operability of the lines of random access memory and the content address memory cells of the cache memory block.

22. The integrated circuit as in claim 21, wherein:

the means for processing comprises a multiple input signature register comprising a plurality of serially connected shift registers, and data within a predetermined one of the shift registers provides the indication of overall operability upon completion of the test algorithm.

23. The integrated circuit as in claim 22, wherein:

during a first test stage, the means for supplying addresses sets tag data in all cells of each respective way-set to a respective one of a plurality of common predetermined tag values; and during a second test stage, the means for supplying addresses sets tag data in all cells of all of the way-sets to a single common predetermined tag value.

* * * * *